United States Patent
McKinnon et al.

(10) Patent No.: US 6,680,612 B1
(45) Date of Patent: Jan. 20, 2004

(54) GRADIENT COIL APPARATUS FOR MAGNETIC RESONANCE IMAGING

(75) Inventors: Graeme Colin McKinnon, Hartland, WI (US); Qin Liu, Waukesha, WI (US)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 0 days.

(21) Appl. No.: 10/065,417

(22) Filed: Oct. 16, 2002

(51) Int. Cl.[7] .................................................. G01V 3/00
(52) U.S. Cl. ...................................... 324/318; 324/322
(58) Field of Search ................................. 324/318, 322, 324/300, 306, 307, 309, 312, 314

(56) References Cited

U.S. PATENT DOCUMENTS 5,311,135 A 5/1994 Vavrek et al. ............... 324/318

FOREIGN PATENT DOCUMENTS

WO   WO 02/075345 A1   9/2002   ......... G01R/33/385

OTHER PUBLICATIONS

Paul R. Harvey and Ehud Katznelson; "Modular Gradient Coil: A New Concept in High–Performance Whole–Body Gradient Coil Design;" Magnetic Resonance In Medicine 42:561–570 (1999); pp. 561–570.

Ralph Kimmlingen, Matthias Gebhardt, Johann Schuster, Martin Brand, Franz Schmitt, and Axel Haase; " Gradient System Providing Continuously Variable Field Characteristics;" Magnetic Resonance in Medicine 47:800–808 (2002); pp. 800–808.

U.S. patent application Ser. No. 10/063,421, Qin Liu et al., filed Apr. 22, 2002.

*Primary Examiner*—Louis Arana
(74) *Attorney, Agent, or Firm*—Cantor Colburn LLP

(57) ABSTRACT

A gradient coil assembly for use with an MR imaging system comprising: a main gradient coil disposed about an imaging axis to produce a gradient field; a corrector coil disposed about an imaging axis and positioned with a return portion substantially overlapping a return portion of main gradient coil. The main gradient coil and said corrector coil cooperate to provide a first field of view, the main gradient coil operates to provide a second field of view. A method of reducing power deposition in a gradient coil assembly comprising: determining a first current density corresponding to a first field-of-view for an effective gradient coil; computing a second current density corresponding to a second field of view, by reducing current from the first current density without changing a sign of said the associated therewith; determining a geometry for a main gradient coil; and ascertaining a geometry for a corrector coil.

25 Claims, 4 Drawing Sheets

GRADIENT COIL APPARATUS FOR MAGNETIC RESONANCE IMAGING

BACKGROUND OF INVENTION

The field of the invention is nuclear magnetic resonance (NMR) imaging methods and systems. More particularly, the invention relates to a method and apparatus for formation of a gradient coil with reduced power deposition. It will be appreciated, however, that the invention is also amenable to other like applications.

When a substance such as human tissue is subjected to a uniform magnetic field (e.g., a polarizing field $B_0$ in the z direction), the individual magnetic moments of the spins in the tissue attempt to align with this polarizing field, but precess about it in random order at their characteristic Larmor frequency. If the substance, or tissue, is subjected to a magnetic field (e.g., an excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well-known reconstruction techniques.

The use of gradient coils to generate a gradient field about the bore of a magnet for imaging is known in the art of nuclear magnetic resonance imaging. Generally, a patient is positioned on an examination table and inserted into a bore of a magnet. The magnet provides a uniform magnetic field $B_0$ throughout the bore. The gradient coils extend around the bore and are energized to impose time varying magnetic fields on the uniform magnetic field.

Conventional gradient coils have a fixed field-of-view (FOV). It is generally well known that the larger the FOV, the lower the efficiency rating for a respective coil. That is, a gradient coil with a large FOV requires a higher voltage times ampere product from the gradient amplifier to produce a given gradient strength times gradient slew rate product than a gradient coil with a small FOV. Additionally, since the peak magnetic field, for a given gradient strength, is larger with large FOV coils, for a given slew rate, high dB/dt is associated with larger FOVs, which can result in increased peripheral nerve stimulation (PNST). Hence imaging protocols requiring high gradient power and high slew rate are generally performed on MRI systems equipped with a small FOV gradient set.

Due to the above-mentioned physiological effects on the patient, constraints are placed on maximum switching speeds (slew rate) for the gradient fields. Time-varying magnetic fields induce currents in conductive materials and rapidly changing field gradients can induce currents in a patient being imaged. Under some circumstances, these induced currents can stimulate nerves, a phenomenon known as peripheral nerve stimulation (PNST). Therefore, every MRI employed for human patients must conform to one or more magnetic field rate of change limitations in accordance with regulations from the FDA and other regulatory agencies. Thus, current MRI systems, therefore, limit the gradient slew rates accordingly.

All gradient coil designs intended for human use will have physiologic limits. The slew rate, which gives the limit, however, will depend on the effective length of the coil. Note that, the effective length L is not necessarily the true length of the coil. The effective coil length is the ratio of the maximum field strength (mT) found within the gradient coil divided by the applied gradient strength (mT/m). While the effective coil length has units of length, it does not relate to any physical dimension within the coil. It should not be confused with the distance from the iso-center of the gradient coil to the location of maximum field variation. Maximum field strength is defined as the vector sum of all three components of field produced by the gradient coil axis.

A number of improvements have been developed to provide more than one FOV for the gradient field in MRI systems. One approach is to integrate two sets of gradient coils on one system to provide two distinct FOV sizes. Manufacturing a coil with this approach is relatively straightforward, however, coil efficiency is greatly reduced. So-called twin coil designs require multiple coils and their respective shields to be stacked within a limited space. However, coil efficiency is dependent upon separation of the shield coil from the primary coil. Therefore twin coil designs result in less efficient operation. The UK patent application GB 2,295,020 describes a modular gradient coil system that unites, in one coil body, a gradient coil for rapid measuring sequences and an activatable gradient coil for conventional measuring sequences. The gradient coil for rapid measuring sequences has a small linearity volume and allows rapid switching of gradient fields. In the joint operation of the two coils, the gradient coil system has a large linearity volume for conventional measuring sequences with slowly switched gradient fields.

Another approach requires the disabling or enabling of certain parts of the gradient coil windings to adjust the FOV. U.S. Pat. No. 5,311,135 teaches a gradient coil for a magnetic resonance device which has four saddle-shaped coils, each of which has first and second terminal points respectively at the beginning and end of its conductor, as well as at least one tapping point between the terminal points. The arrangement also includes a switching mechanism, so that each of the two coils can be supplied with current either between the terminal points or between the first terminal point and the tapping point. In this way, at least two different linearity volumes of the gradient coils can be set, for instance corresponding to a size of a region that is being imaged. Advantageously, here, multiple fields of view are obtained from primary and shield windings each on only one surface, with maximal separation. However, the respective windings are each divided into different circuits, capable of being individually supplied with current. When these circuits are driven such that their generated fields reinforce each other, the large field of view mode is achieved. The small field of view (high slew rate) mode is achieved when only one circuit is used, or the fields are opposed. Advantageously, this type of coil is more efficient than a "twin" coil. However difficulties include the reduced freedom in terms of optimizing the field linearity; and also the difficulty in coil construction, due to the need for multiple connections between windings.

Similarly, a gradient coil with at least two independently controllable portions, with multiple control states for generating a gradient field for imaging multiple regions is described in article: Gradient System Providing Continuously Variable Field Characteristics, Magnetic Resonance in Medicine, 47:800(2002) by Kimmlingen et al. In this patent, by controlling gradient fields for at least two imaging sub-regions, with neither of the two regions being a subset of the other, it is possible to pick up MR images for a larger aggregate imaging area, which derives at least from the sum of the two imaging sub-regions, using rapid, high-resolution measuring sequences without triggering stimulations.

Configurations of gradient coils that employ extra "twin" or excess coils are costly and complicated. Moreover, "twin" or dual field of view gradient coils are less efficient than single field of view systems. Generally, only one coil can be designed to be efficient, but typically, both are compromised. Additionally, gradient coil configurations that employ separate circuits are generally efficient for one field of view, and yet less efficient for another field of view. Inefficient gradient coil configurations require additional space and result in excess heat generation. Therefore, there is a need in the art for a gradient coil design that provides improved efficiency and satisfies the need for multiple fields of view, and current regulatory requirements for slew rate, without excessive complication and cost.

SUMMARY OF INVENTION

The above discussed and other drawbacks and deficiencies are overcome or alleviated by the embodiments as disclosed herein.

A method of configuring a gradient coil in a variable field-of-view gradient coil assembly for use with an MR imaging system comprising: determining a first current density corresponding to a first field-of-view for an effective gradient coil; computing a second current density corresponding to a second field of view, by reducing current from the first current density without changing the sign of said current associated therewith; determining a geometry for a main gradient coil to provide said second field of view; and ascertaining a geometry for a corrector coil.

Also disclosed herein is method reducing power deposition in a variable field-of-view gradient coil assembly for use with an MR imaging system comprising: determining an effective gradient coil configuration corresponding to a first field-of-view; determining a geometry for a main gradient coil for a second field of view; ascertaining a geometry for a corrector coil; and ensuring that a return conductor for the main gradient coil and the corrector coil substantially overlap.

Another disclosure herein is a gradient coil assembly with variable FOV for use with an MR imaging system, the coil assembly comprising: a main gradient coil disposed about an imaging axis to produce a gradient field; a corrector coil disposed about an imaging axis and positioned with a return portion substantially overlapping a return portion of main gradient coil. The main gradient coil and said corrector coil operate in conjunction to provide a first field of view and the main gradient coil operates to provide a second field of view.

Yet another disclosure herein is for an MRI system comprising: a magnetic resonance imaging (MRI) system with a gradient coil assembly for variable field of view imaging. The gradient coil assembly comprising: a main gradient coil disposed about an imaging axis to produce a gradient field; a corrector coil disposed about an imaging axis and positioned with a return portion substantially overlapping a return portion of the main gradient coil. The main gradient coil and the corrector coil operate in conjunction to provide a first field of view and the main gradient coil operates to provide a second field of view.

The above discussed and other features and advantages of the present invention will be appreciated and understood by those skilled in the art from the following detailed description and drawings.

BRIEF DESCRIPTION OF DRAWINGS

Referring to the exemplary drawings wherein like elements are numbered alike in the several Figures.

DETAILED DESCRIPTION

Recently a corrector coil concept has been disclosed. This involves a gradient system having an efficient main coil for one configuration e.g., field of view, and then a second configuration comprising the main coil supplemented with a corrector coil.

See commonly assigned U.S. patent application Ser. No. 10/063,421 filed Apr. 22, 2002. Disclosed herein is an MRI method and system including a gradient coil that facilitates efficient MR imaging for multiple fields of view (FOV) while avoiding peripheral nerve stimulation (PNST). More specifically, disclosed herein is a design strategy for minimizing the power deposition in a gradient coil comprised of a main coil and a corrector coil, such that both configurations operate efficiently with respect to performance and heating losses.

To improve MR methods and scans, it is desirable to minimize the duration of the gradient pulse sequences. Increasing the slew rate will have the effect of reducing pulse durations and thereby the sequences. However, as mentioned earlier, important physiological limits must be considered. Slew rates that create dB/dt above selected threshold levels, may induce nerve stimulation in patients. For any gradient coil, dB/dt is directly proportional to the slew rate, and varies as a function of position in and around the gradient coil. The geometry of the coil will also have a substantial effect. For example, the maximum dB/dt in a small FOV cylindrical coil will be lower than the maximum dB/dt in a larger FOV coil, all other factors, such as linearity over the FOV, being the same. Hence, the desire for greater linearity and FOV conflicts with the desire to minimize PSNT. The decision which to favor depends upon the particular application, such as cardiac imaging or abdomen imaging. Since both applications are typically done on one scanner, one solution has been to provide two sets of gradient coils within the same scanner.

Figure 1:
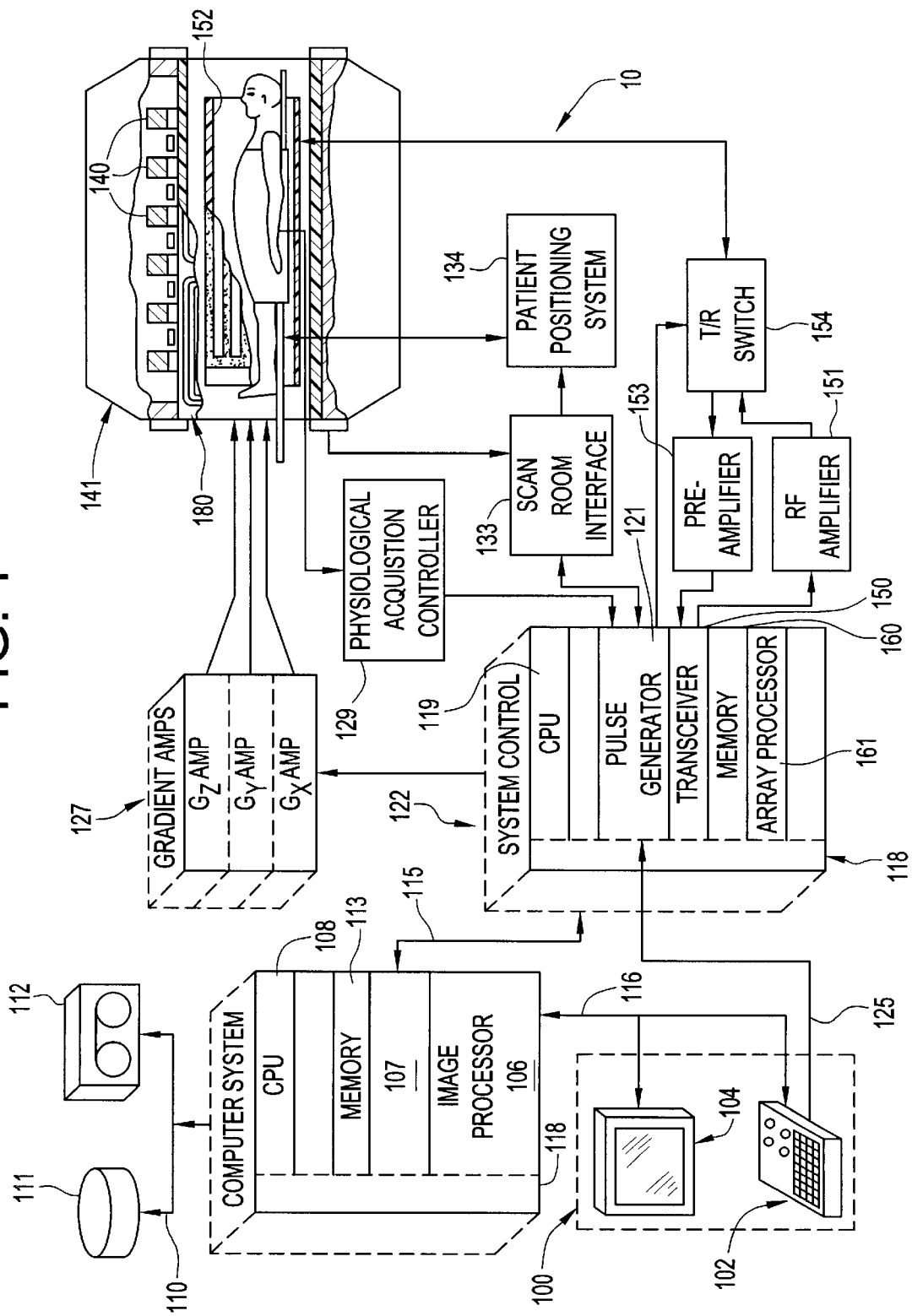
FIG. 1 depicts an exemplary MRI system.

Referring to FIG. 1, there is shown the major components of an exemplary MRI system 10, within which an exemplary embodiment may be implemented. The operation of the system is controlled from an operator console 100, which includes a keyboard and control panel 102 and a display 104. The console 100 communicates through a link 116 with a separate computer system 107 that enables an operator to control the production and display of images on the screen 104. The computer system 107 includes a number of modules, which communicate with each other through a backplane. These include an image processor module 106, a CPU module 108 and a memory module 113, known in the art as a frame buffer for storing image data arrays. The computer system 107 is linked to storage media 111 and 112, depicted as disk storage and a tape drive respectively for storage of image data and programs, and it communicates with a separate system control 122 through a high speed serial link 115.

The system control 122 includes a set of modules connected together by a backplane 118. These include a CPU module 119 and a pulse generator module 121, which connects to the operator console 100 through a serial link 125. It is through this link 125 that the system control 122 receives commands from the operator that indicate the scan sequence that is to be performed. As will be described in more detail below, the operator enters parameters, which indicate the prescribed scan. From these parameters, a pulse sequence is calculated and downloaded to the pulse generator module 121.

The pulse generator module 121 operates the system components to carry out the desired scan sequence. It produces data, which indicates the timing, strength and shape of the RF pulses that are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. Finally, the pulse generator module 121 connects to a scan room interface circuit 133, which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier 127 comprised of $G_x$, $G_y$, and $G_z$ amplifiers. Each gradient amplifier 127 excites a corresponding gradient coil (not shown) in an assembly generally designated 180 to produce the magnetic field gradients used for position encoding acquired signals. The gradient assembly 180, then, consists of three sets of gradient coils; two transverse sets producing $G_x$ and $G_y$, and a longitudinal set producing $G_z$. Each set of coils typically consists of a primary winding and a shield winding. The shield winding prevents eddy current being induced in the polarizing magnet 140. For a corrector coil system, as discussed above, each set will consist of four windings. These are the main primary, the main shield, the corrector primary and the corrector shield. The gradient coil assembly 180 forms part of a magnet assembly 141, which includes a polarizing magnet 140 and a whole-body RF coil 152. A transceiver module 150 in the system control 122 produces pulses, which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified MR signals are demodulated, filtered, and digitized in the receiver section of the transceiver 150. The transmit/receive switch 154 is controlled by a signal from the pulse generator module 121 to electrically connect the RF amplifier 151 to the RF coil 152 during a transmit mode and to connect the preamplifier 153 during a receive mode. The transmit/receive switch 154 also enables a separate RF coil 152 (for example, a head coil or surface coil) to be used in either the transmit mode or receive mode.

The MR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in a storage medium 111 or 112 such as disk memory or tape drive. The storage medium 111 and 112 could be various storage methodologies, such as disk, static memory, solid state, removable media, and the like, as well as combinations including at least one of the foregoing. In response to commands received from the operator console 100, this image data may be archived on the tape drive, or it may be further processed by the image processor 106, and conveyed to the operator console 100 and presented on the display 104.

Referring still to FIG. 1, the NMR signal produced by the subject is picked up by the receiver coil 152 and applied through the preamplifier 153 to the input of a transceiver 150. The received signal is at or around the Larmor frequency, and this high frequency signal is down converted in a two-step process, which first mixes the NMR signal with a carrier signal and then mixes the resulting difference signal with a reference signal. The down converted NMR signal is applied to the input of an analog-to-digital (A/D) converter, which samples and digitizes the analog signal and applies it to a digital detector and signal processor which produces in-phase (I) values and quadrature (Q) values corresponding to the received NMR signal. The resulting stream of digitized I and Q values of the received signal are output through backplane 118 to the memory module 160 and array processor 161 where they are employed to reconstruct an image.

Figure 2:
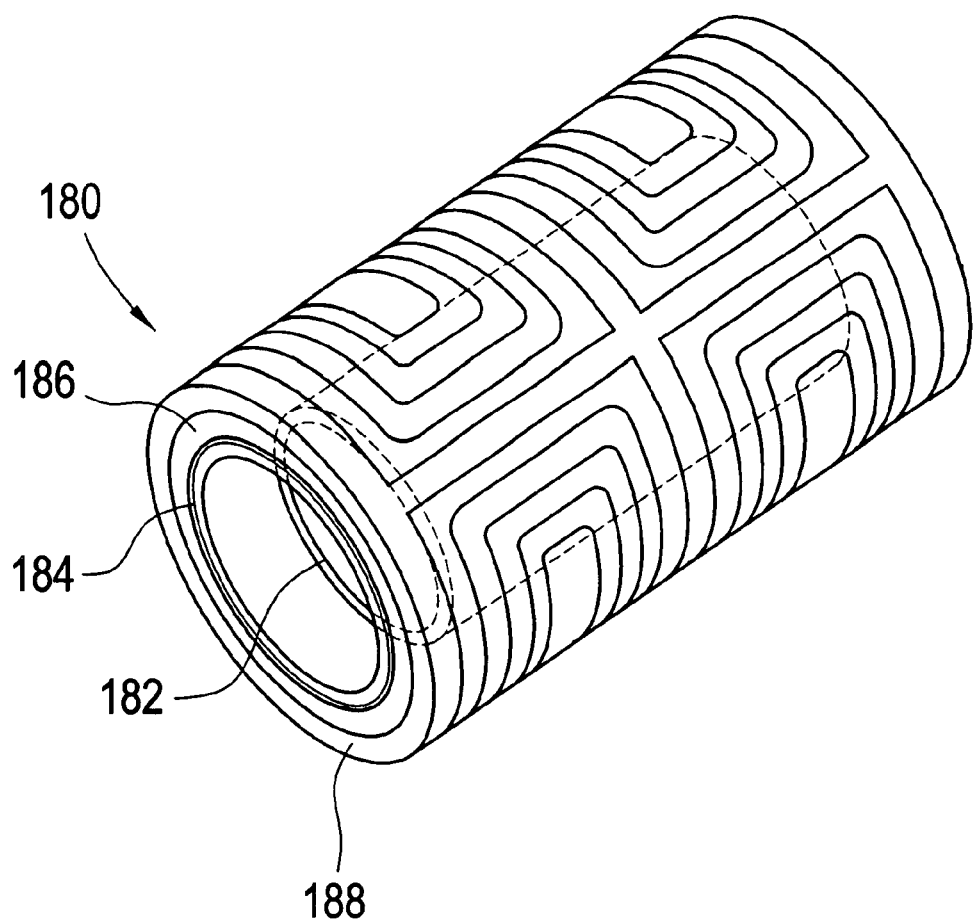
FIG. 2 depicts an existing gradient coil design utilizing main and corrector coils.

Turning now to FIG. 2, a gradient coil assembly 180 is depicted including multiple gradient coils for several axes. Such a configuration facilitates maintaining linear region of magnetic field gradient to be reduced or enlarged as desired to conform to a selected size of a region of interest. Additionally, such a configuration facilitates reductions of the magnetic field utilized when imaging smaller regions and conversely, larger magnetic fields within smaller regions of interest, and thereby reduced imaging durations. In the figure, a gradient coil assembly 180 for use with an MRI system such as that disclosed with reference to FIG. 1 is shown. Gradient coil assembly 180 includes a primary main gradient coil 182 shown in phantom. Gradient coil assembly 180 further includes a primary corrector coil 184 including a first half (not shown) and a second half (not shown). Positioned circumferentially about the corrector coil 184 is a secondary gradient coil denoted corrector shielding coil 186. Corrector shielding coil 186 operates to provide electromagnetic shielding for the primary corrector coil 184. Corrector shielding coil 186 assists in preventing eddy current from being induced in magnet 140 of FIG. 1. Similarly, coil assembly 180 further includes a secondary gradient coil denoted main shielding coil 188 disposed circumferentially about shielding coil 186. Main shielding coil 188 functions as a shielding coil for the primary main gradient coil 182 and likewise operates to prevent eddy current from being induced in the magnet 140. The radial order of the main and corrector primary coils, and shield coils, may be changed, however the shield coils always enclose the primary coils.

Disclosed herein in an exemplary embodiment is an MRI method and system including a gradient coil assembly 180 that facilitates efficient MR imaging while avoiding PNST.

The disclosed embodiments involve having an efficient main gradient coil 182 for one configuration, and then a second configuration comprised of the main gradient coil 182 supplemented with a corrector coil 184. A design strategy is disclosed for minimizing the power deposition in transverse gradient coils, such that both configurations operate efficiently with respect to performance and heating losses. Therefore, an appreciation of the power dissipation in the gradient coil assembly 180 is beneficial.

The corrector coil concept is a little similar to the tapped coil concept discussed earlier in that it tries to improve the efficiency (as compared with the twin coil) by utilizing the maximal primary to shield distance in both field of view modes. However here an additional surface is used (like the twin coil), for the corrector coil 184. FIG. 2 schematically depicts a gradient coil assembly 180 including a main gradient coil 182 and a corrector coil 184. A high efficiency main gradient coil 182, with a given field of view is designed, and then the corrector coil 184 are designed such that the combined field from the coils produces a second field of view. It will further be appreciated that based upon the abovementioned concept, an infinite variety of combinations is envisioned, and thereby, an infinite number of fields of view.

There are two primary options for design with the corrector coil concept for implementation of a gradient coil assembly 180. The first uses a large field of view main gradient coil 182, while the second utilizes the main gradient coil 182 providing a small field of view. It will be appreciated that the second approach yields a more power efficient result. With the first approach, the corrector coil 184 is employed to produce a field, which cancels a portion of the field generated from the main coil 182. In other words, there are various regions where the current in the corrector coil 184 is flowing counter (e.g., opposite direction) to the current in the main gradient coil 182. Therefore, heat is being generated yet no net increase in field strength is achieved.

Considering the above observations, it may now be appreciated that to produce a power efficient gradient coil apparatus 180 the main gradient coil 182 should be designed and configured to exhibit the smaller field of view when operating alone. Likewise, this implies that the main gradient coil 182 and corrector coil 184 when operating in conjunction should be configured to provide the large field of view. However, it will be further appreciated that one can further improve on having the main gradient coil 182 supply the small field of view; a second loss mechanism results if the return windings on the main gradient coil providing a small field of view overlap with the forward windings on the corrector coil. Forward windings (e.g., those near to isocenter) mainly determine the gradient field strength, whereas the return windings primarily provide a circuit path for the current return. Therefore, a second consideration to enhance efficiency is to ensure that the return winding for the main gradient coil 182 and the forward winding for the corrector coil 184 are isolated. One method to ensure such isolation is to arrange the return winding for the main gradient coil 182 and corrector coil 184 in a manner so that they overlap. More generally then, these concepts may be considered together: Ensure that the return paths for the windings of the main gradient coil 182 and corrector coil overlap as much as possible, and that the current in the return windings is flowing in the same direction. This concept will become more evident with an appreciation of the power dissipated in the main gradient coil 182 and corrector coil 184.

The power dissipated in a gradient coil is:

$$P_d = \frac{\rho a}{t} \int_{-\infty}^{\infty} \int_0^{2\pi} [(J_z(\phi, z))^2 + (J_\varphi(\varphi, z))^2] d\varphi\, dz. \qquad [1]$$

where $\rho$ is conductivity, a is coil radius, and t is conductor thickness.

For a transverse gradient coil we use only the first order term (m=1) in the cylindrical harmonic expansion. Hence the azimuthal and longitudinal current densities are:

$$J_\phi(\phi,z) = j_\phi(z)\cos(\phi), \text{ and} \qquad [2]$$

$$J_z(\phi,z) = j_z(z)\sin(\phi), \text{ respectively.} \qquad [3]$$

For any gradient design procedure, $j_\phi(z)$ is known as the azimuthal current density. This current density function primarily defines the linearity region for MRI, as the $j_z(z)$ term doesn't produce any z component to the gradient field.

It will be appreciated that $j_\phi(z)$ and $j_z(z)$ are related through the divergence theorem for current. Once $j_\phi(z)$ is chosen, $j_z(z)$ is also automatically specified. Hence minimizing power deposition is practically equivalent to minimizing:

$$p = \int_\infty^\infty (j_\phi(z))^2\, dz, \qquad [4]$$

where the integral is over the length of the gradient coil.

In the main plus corrector coil gradient design procedure, the main gradient coil 182 gives one gradient configuration, and the main gradient coil 182 plus the corrector coil 184 defines another gradient configuration. This combination is denoted an effective coil herein. The power dissipation for the main gradient coil 182 is proportional to:

$$p^m = \int_\infty^\infty (j_\phi^m(z))^2 + (j_\phi^c(z))^2\, dz, \qquad [5]$$

and the power dissipation for the combined configuration of the effective coil is proportional to:

$$p^{m+c} = \int_\infty^\infty [(j_\phi^m(z))^2 + (j_\phi^c(z))^2]\, dz. \qquad [6]$$

the linearity region for the combined configuration of the effective coil, on the other hand, depends on:

$$j^{m+c}\phi(z) = j^m\phi(z) = j^c\phi(z) \qquad [7]$$

Consider now a single coil implementation of the effective coil (main gradient coil 182 combined with corrector coil 184) configuration. The power deposition here is:

$$p^s = \int_\infty^\infty [(j_\phi^m(z))^2 + (j_\phi^c(z))^2 + 2(j_\phi^m(z))(j_\phi^c(z))]\, dz. \qquad [8]$$

Now if the azimuthal current densities in the main gradient coil 182 and corrector coil 184 always have the same sign (as a function of position z), that is:

$$\text{sign}(j^m\phi(z)) = \text{sign}(j^c\phi(z)), \qquad [9]$$

then power in a single coil implementation ($P^s$) will always be greater than the power deposition in an effective coil implementation ($P^{m+c}$). Thus the corrector coil approach to a gradient coil apparatus 180 employing "twin" coils has a power deposition advantage over utilizing two separate coils individually if Equation [9] is satisfied.

Recall, the main plus corrector coil approach is used to achieve two different field-of-views. Thus, the obvious implication of Equation [9] is that the main gradient coil 182 should be the coil with the shorter field-of-view. If the main gradient coil 182 is configured to provide a larger field-of-view, current cancellation will be required to achieve the smaller field of view and thereby, Equation [9] would be violated.

Figure 3:
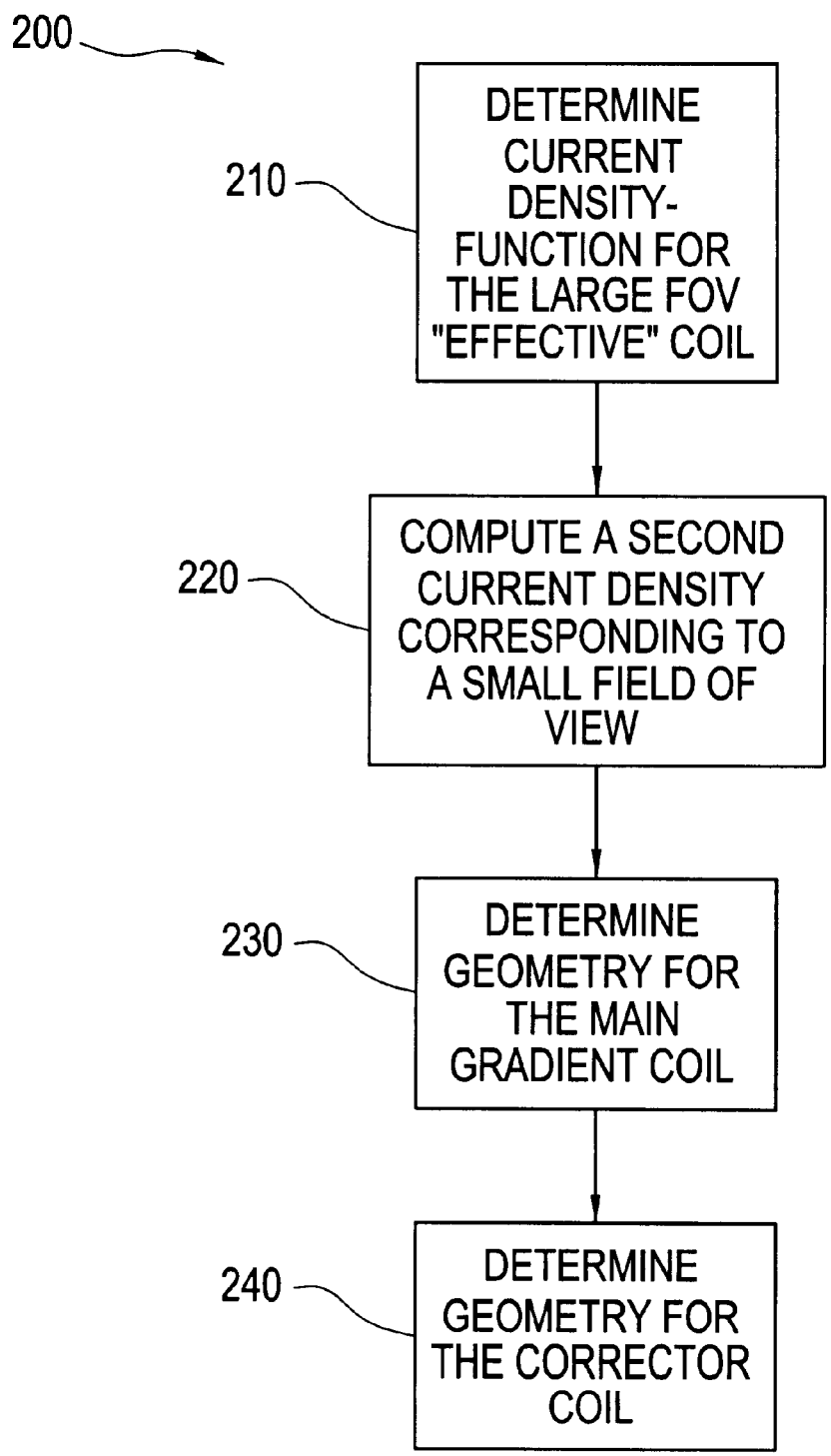
FIG. 3 depicts a simplified flow chart depicting a methodology for creating a gradient coil in accordance with an exemplary embodiment.

Therefore, continuing with FIG. 2 and referring to FIG. 3 as well, a generalized design methodology 200 for developing main gradient coil 182 plus corrector coils 184 is illustrated. Referring to the figure, at process block 210, the current density function for the effective coil (main gradient coil 182 combined with corrector coil 184) for large field-of-view is designed and determined. Yielding an effective coil configuration dictating particular coil geometry with a given current density and thereby given wire density. With the current density for a large field of view effective coil determined, the methodology 200 moves to process block 220. At process block 220 current is "removed" from the large field of view current density function, without changing the sign of the current (and thereby satisfying Equation [9]) within the resulting function, until the desired small field-of-view current density function is achieved as depicted at decision block 230. This yields a configuration for a gradient coil for the small field-of-view, and thus the main gradient coil 182 geometry and thereby a given wire density. Finally, at process block 240, with the geometry for the corrector coil 184, may readily be determined as the difference between the effective coil and the main gradient coil 182. It will be appreciated that the resultant of the process herein is somewhat similar to the idea of using a tapped winding. Although, in this case, instead of removing physical windings to get a smaller field-of-view, we are removing part of the current density to adjust the field of view.

Figure 4:
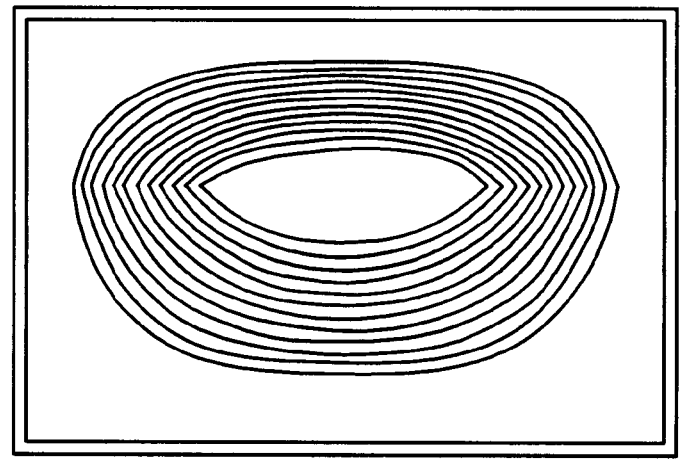
FIG. 4 depicts a wire pattern for one quadrant of a main gradient coil for an exemplary embodiment.
Figure 5:
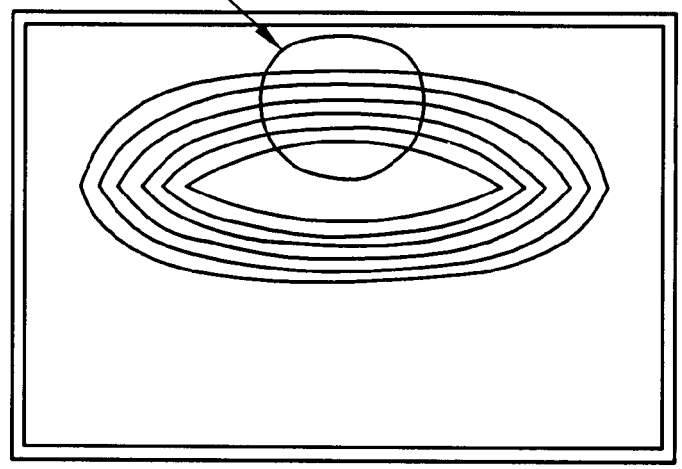
FIG. 5 depicts a wire pattern for one quadrant of a corrector coil for an exemplary embodiment.
Figure 6:
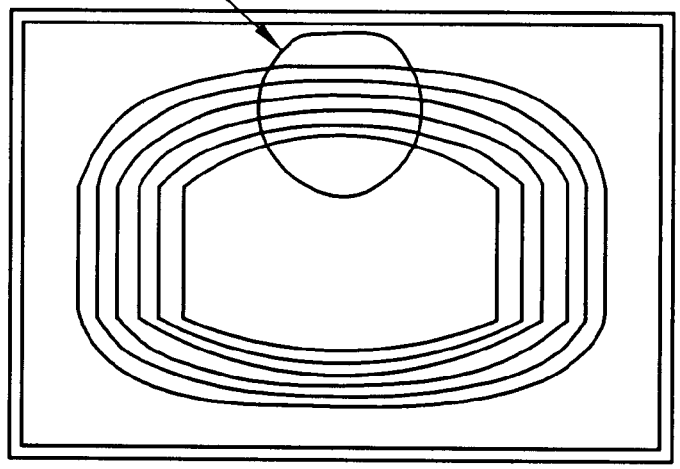
FIG. 6 depicts a wire pattern for one quadrant of an equivalent "effective" coil for an exemplary embodiment.

Turning now to FIGS. 4, 5, and 6 as well, the features and advantages of the disclosed embodiments may become readily apparent. FIG. 4 depicts exemplary wire patterns for one quadrant of a main gradient coil 182, a corrector coil 184, and the equivalent effective coil. It will be evident from observation of these figures the methodology for formation of the main gradient coil 182 and there from, the coil 184. In FIG. 4 the right most pattern depicts an exemplary wire pattern configured to provide a large field of view. From this effective coil design, a main gradient coil 182 may be ascertained by the process 220 to arrive at a coil configuration that provides a desired small field of view. Finally, the geometry of the necessary corrector coil 184 may be determined as identified in process 230.

The wire patterns depicted in FIGS. 4, 5, and 6 correspond to the right half of a coil (iso-center in this example is to the left). The main gradient coil 182 winding has the return path pushed out to the right so that it overlaps with the corrector coil 184 return path. Therefore, the sum of the fields generated by the two windings produces a magnetic field identical to that from the "equivalent coil" show on the right.

In an alternative embodiment, it will be appreciated that instead of removing current from the current density as described at process block 210, instead current could be added. In this embodiment, once the corrector coil 184 is ascertained, it will be appreciated that if the current is reversed in the coil a different field of view can be obtained by the combination of the main gradient coil 182 and the corrector coil 184. In an exemplary embodiment, the field of view obtained in this configuration is smaller than that for the main gradient coil 182.

The system and methodology described in the numerous embodiments hereinbefore provides a system and method reducing power deposition in transverse gradient coils that facilitates MR imaging and avoiding peripheral nerve stimulation (PNST), and potentially increasing gradient slew rates for reduced overall imaging durations. In addition, the disclosed invention may be embodied in the form of computer-implemented processes and apparatuses for practicing those processes.

The present invention can also be embodied in the form of computer program code containing instructions embodied in tangible media, such as floppy diskettes, CD-ROMs, hard drives, or any other computer-readable storage medium such as 111 and 112, wherein, when the computer program code is loaded into and executed by a computer, the computer becomes an apparatus for practicing the invention. The present invention can also be embodied in the form of computer program code, for example, whether stored in a storage medium 111, 112, loaded into and/or executed by a computer, or as data signal 110 transmitted whether a modulated carrier wave or not, over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A method of configuring a gradient coil in a variable field-of-view gradient coil assembly for use with an MR imaging system comprising:

determining a first current density corresponding to a first field-of-view for an effective gradient coil;

computing a second current density corresponding to a second field of view, by reducing current from said first current density without changing a sign of said current associated therewith;

determining a geometry for a main gradient coil to provide said second field of view; and ascertaining a geometry for a corrector coil.

2. The method of claim 1 further including ensuring that a return conductor for said main gradient coil and said corrector coil substantially overlap.

3. The method of claim 1 wherein said first field-of-view is larger than said second field of view.

4. The method of claim 1 wherein said ascertaining comprises a difference between said effective gradient coil and said main gradient coil.

5. The method of claim 1 wherein said effective gradient coil comprises a combination of said main gradient coil and said corrector coil.

6. A method of configuring a gradient coil in a variable field-of-view gradient coil assembly for use with an MR imaging system comprising:
  determining an effective gradient coil configuration corresponding to a first field-of-view;
  determining a geometry for a main gradient coil for a second field of view; ascertaining a geometry for a corrector coil; and
  ensuring that a return conductor for said main gradient coil and said corrector coil substantially overlap.

7. The method of claim 6 wherein said first field-of-view is larger than said second field of view.

8. The method of claim 6 wherein said ascertaining comprises establishing a difference between said effective gradient coil and said main gradient coil.

9. The method of claim 6 wherein said effective gradient coil comprises a combination of said main gradient coil and said corrector coil.

10. The method of claim 6 further comprising establishing a first current density associated with said effective gradient coil and said first field of view and computing a second current density associated with said main gradient coil.

11. The method of claim 10 wherein said computing is accomplished by reducing current from said first current density without changing a sign of said current associated therewith.

12. The method of claim 10 further comprising establishing a third field of view associated with said main gradient coil and said corrector coil responsive to a third current density.

13. The method of claim 12 wherein said establishing is accomplished by a difference between said second current density and a current density associated with said corrector coil.

14. The method of claim 12 wherein said third field of view is smaller than said first field of view.

15. A gradient coil assembly with variable field of view for use with an MR imaging system, the coil assembly comprising:
  a main gradient coil disposed about an imaging axis to produce a gradient field;
  a corrector coil disposed about an imaging axis and positioned with a return portion substantially overlapping a return portion of said main gradient coil;
  wherein said main gradient coil and said corrector coil operate in conjunction to provide a first field of view; and
  wherein in said main gradient coil operates to provide a second field of view.

16. The gradient coil assembly of claim 15 wherein said first field-of-view is larger than said second field of view.

17. The gradient coil assembly of claim 15 further comprising said main gradient coil and said corrector coil operate in conjunction to provide a third field-of-view.

18. The gradient coil assembly of claim 15 wherein said third field-of-view is smaller than said first field of view.

19. The gradient coil assembly of claim 15 further comprising a first current density associated with said main gradient coil and said corrector coil corresponding to said first field of view and a second current density associated with said main gradient coil corresponding to said second field of view.

20. The gradient coil assembly of claim 19 wherein said a second current density is computed by reducing current from said first current density without changing a sign of said current associated therewith.

21. The gradient coil assembly of claim 19 further comprising a third field of view associated with said main gradient coil and said corrector coil responsive to a third current density.

22. The gradient coil assembly of claim 21 wherein said third field of view is responsive to a difference between said second current density and a current: density associated with said corrector coil.

23. The gradient coil assembly of claim 21 wherein said third field of view is smaller than said first field of view.

24. A gradient coil assembly with variable field of view for use with an MR imaging system configured by a method comprising:
  determining a first current density corresponding to a first field-of-view for an effective gradient coil;
  computing a second current density corresponding to a second field of view, by reducing current from said first current density without changing a sign of said current associated therewith;
  determining a geometry for a main gradient coil to provide said second field of view; and
  ascertaining a geometry for a corrector coil.

25. An MRI system comprising:
  a magnetic resonance imaging (MRI) system with a gradient coil assembly for variable field of view imaging comprising:
    a main gradient coil disposed about an imaging axis to produce a gradient field;
    a corrector coil disposed about an imaging axis and positioned with a return portion substantially overlapping a return portion of said main gradient coil;
    wherein said main gradient coil and said corrector coil operate in conjunction to provide a first field of view; and
    wherein in said main gradient coil operates to provide a second field of view.

* * * * *

UNITED STATES PATENT AND TRADEMARK OFFICE
CERTIFICATE OF CORRECTION

PATENT NO. : 6,680,612 B1  Page 1 of 1
APPLICATION NO. : 10/065417
DATED : January 20, 2004
INVENTOR(S) : Graeme Colin McKinnon et al.

It is certified that error appears in the above-identified patent and that said Letters Patent is hereby corrected as shown below:

Column 8
Line 38, delete " $p^m = \int_{\infty}^{\infty} (j_\phi^m(z))^2 + (j_\phi^c(z))^2 \, dz$ " and insert therefor -- $p^m = \int_{\infty}^{\infty} (j^m{}_\varphi(z))^2 \, dz$ --.

Column 8
Line 47, before "linearity", delete "the" and insert therefor -- The --.

Column 8
Line 50, delete " $j^{m+c}\phi(z) = j^m\phi(z) = j^c\phi(z)$ " and insert therefor -- $j^{m+c}{}_\varphi(z) = j^m{}_\varphi(z) + j^c{}_\varphi(z)$ --.

Column 12
Line 23, after "current" (second occurrence), delete ":".

Signed and Sealed this

Seventeenth Day of October, 2006

JON W. DUDAS
*Director of the United States Patent and Trademark Office*